(12) United States Patent
Kim et al.

(10) Patent No.: US 8,575,628 B2
(45) Date of Patent: Nov. 5, 2013

(54) ORGANIC LIGHT EMITTING DISPLAY

(75) Inventors: Hyung-Soo Kim, Yongin (KR); Soon-Sung Ahn, Yongin (KR); Do-Ik Kim, Yongin (KR); Keum-Nam Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 12/975,285

(22) Filed: Dec. 21, 2010

(65) Prior Publication Data

US 2011/0291115 A1    Dec. 1, 2011

(30) Foreign Application Priority Data

Jun. 1, 2010  (KR) .................. 10-2010-0051728

(51) Int. Cl.
*H01L 29/18*    (2006.01)
*H01L 33/00*    (2010.01)

(52) U.S. Cl.
USPC ............................. 257/88; 345/212; 345/82

(58) Field of Classification Search
USPC ............... 257/88, E33.055; 345/82, 212
See application file for complete search history.

(56) References Cited

U.S. PATENT DOCUMENTS

| | | | |
|---|---|---|---|
| 7,671,824 B2 * | 3/2010 | Yoon et al. ................. | 345/63 |
| 2002/0030449 A1 * | 3/2002 | Okazaki et al. ............. | 315/169.1 |
| 2002/0033806 A1 * | 3/2002 | Vossen et al. ............... | 345/204 |
| 2008/0180364 A1 * | 7/2008 | Kim ............................. | 345/76 |
| 2009/0309863 A1 * | 12/2009 | Seto ............................. | 345/212 |
| 2010/0073406 A1 * | 3/2010 | Shishido et al. ............. | 345/691 |
| 2011/0043470 A1 * | 2/2011 | Ishihara et al. ............. | 345/173 |
| 2011/0261044 A1 * | 10/2011 | Shin et al. ................... | 345/211 |

FOREIGN PATENT DOCUMENTS

| | | |
|---|---|---|
| JP | 2003-108068 | 4/2003 |
| KR | 10-2001-0077573 A | 8/2001 |
| KR | 10-2005-0123329 | 12/2005 |
| KR | 10-2006-0065084 A | 6/2006 |
| KR | 10-2009-0042714 A | 4/2009 |

OTHER PUBLICATIONS

KIPO Office Action dated Nov. 30, 2011 for Korean Priority Patent Application No. 10-2010-0051728, 3 pages.
KIPO Office action dated Jul. 19, 2012, for Korean priority Patent application 10-2010-0051728, (1 page).

* cited by examiner

*Primary Examiner* — Jarrett Stark
*Assistant Examiner* — John M Parker
(74) *Attorney, Agent, or Firm* — Christie, Parker & Hale, LLP (57) ABSTRACT

An organic light emitting display having first pixel power source lines receiving a pixel driving voltage from first power supply sources and second pixel power source lines arranged between the first pixel power source lines and receiving a pixel driving voltage from second power supply sources, the light emitting diode of each of a plurality of pixels included in an image display unit is divided into two, and the divided light emitting diodes are coupled to the different pixel power source lines so that brightness non-uniformity of the image display unit caused by the IR drops of the pixel power source lines is reduced or prevented.

9 Claims, 5 Drawing Sheets

ORGANIC LIGHT EMITTING DISPLAY

CROSS-REFERENCE TO RELATED APPLICATION

This application claims priority to and the benefit of Korean Patent Application No. 10-2010-0051728, filed on Jun. 1, 2010, in the Korean Intellectual Property Office, the entire content of which is incorporated herein by reference.

BACKGROUND

1. Field

The following description relates to a flat panel display (FPD).

2. Description of Related Art

Recently, various flat panel displays (FPDs) that are lighter in weight and thinner in volume as compared with cathode ray tubes (CRTs) have been developed. The FPDs include liquid crystal displays (LCDs), field emission displays (FEDs), plasma display panels (PDPs), and organic light emitting displays.

Among the FPDs, the organic light emitting diode is a self-emission element for emitting light from a phosphor by the recombination of electrons and holes, and is divided into passive matrix organic light emitting displays and active matrix organic light emitting displays in accordance with a driving method used therein.

In the active matrix organic light emitting display, a plurality of pixels are arranged in a matrix. Light emission of the pixels is controlled using switch elements such as thin film transistors (TFTs) in the pixels. A display function is performed through scan lines for selecting the pixels, data lines for controlling the light emission of the pixels, and pixel power source lines VDD for supplying voltages (or currents) to the pixels.

The pixel power source lines VDD supply uniform voltages to the plurality of coupled pixels. The values of the voltages applied through the pixel power source lines are to be the same and uniform in terms of the coupled pixels. However, this objective may not be achieved due to IR drops generated by the pixel power source lines since the voltages supplied to the pixels are reduced by the IR drops on the pixels that are remote from an external power supply source.

SUMMARY

Accordingly, aspects of embodiments of the present invention are directed toward an organic light emitting display in which first pixel power source lines receiving a pixel driving voltage from first power supply sources, and second pixel power source lines arranged between the first pixel power source lines and receiving a pixel driving voltage from second power supply sources, are provided. The light emitting diode of each of a plurality of pixels included in an image display unit is divided into two, and the divided light emitting diodes are coupled to the different pixel power source lines so that brightness non-uniformity of the image display unit caused by the IR drops of the pixel power source lines is reduced or prevented.

In order to achieve the foregoing and/or other aspects of the present invention, an embodiment of the present invention provides an organic light emitting display, including an image display unit in which a plurality of pixels are arranged, first pixel power source lines and second pixel power source lines for transmitting pixel driving voltages to the plurality of pixels, and a first power supply source and a second power supply source for providing the pixel driving voltages to the first pixel power source lines and the second pixel power source lines, respectively, wherein each of the plurality of pixels includes a first light emitting diode and a second light emitting diode and a pixel circuit coupled to the first and second light emitting diodes, and wherein the first light emitting diode in each of the pixels is coupled to a corresponding first pixel power source line of the first pixel power source lines, and the second light emitting diode in each of the pixels is coupled to a corresponding second pixel power source line of the second pixel power source lines.

The first pixel power source lines and the second pixel power source lines may be extended in opposite directions.

The first pixel power source lines may be extended from an upper side to a lower side of the image display unit, and the second pixel power source lines may be extended from the lower side to the upper side of the image display unit and may be arranged among the first pixel power source lines.

The first pixel power source lines may be arranged in odd numbered columns of the image display unit, and the second pixel power source lines may be arranged in even numbered columns of the image display unit.

The pixel driving voltages provided by the first and second power supply sources may be positive voltages of a same level.

The organic light emitting display may further include first and second auxiliary pixel power source lines arranged to extend in a direction crossing the first and second pixel power source lines.

The first auxiliary pixel power source lines may be coupled to the first pixel power source lines in a mesh pattern, and the second auxiliary pixel power source lines may be arranged among the first auxiliary pixel power source lines and may be coupled to the second pixel power source lines in a mesh pattern.

The first and second auxiliary pixel power source lines may be formed of a low resistivity metal material and may be formed in a different layer from that of the first and second pixel power source lines.

Contact holes may be formed at crossing regions of the first auxiliary pixel power source lines and the first pixel power source lines and at crossing regions of the second auxiliary pixel power source lines and the second pixel power source lines, and the first and second auxiliary pixel power source lines may be electrically coupled to the first and second pixel power source lines, respectively, through the contact holes.

According to embodiments of the present invention, the distances from the pixel power source lines to the pixels are the same so that it is possible to reduce or prevent the brightness of the image display unit from being non-uniform due to the IR drops of the pixel power source lines.

BRIEF DESCRIPTION OF THE DRAWINGS

The accompanying drawings, together with the specification, illustrate exemplary embodiments of the present invention, and, together with the description, serve to explain the principles of embodiments of the present invention.

DETAILED DESCRIPTION

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via one or more other elements. Further, some of the elements that are not essential to the complete understanding of the invention are omitted for clarity. Also, like reference numerals refer to like elements throughout.

Figure 1:
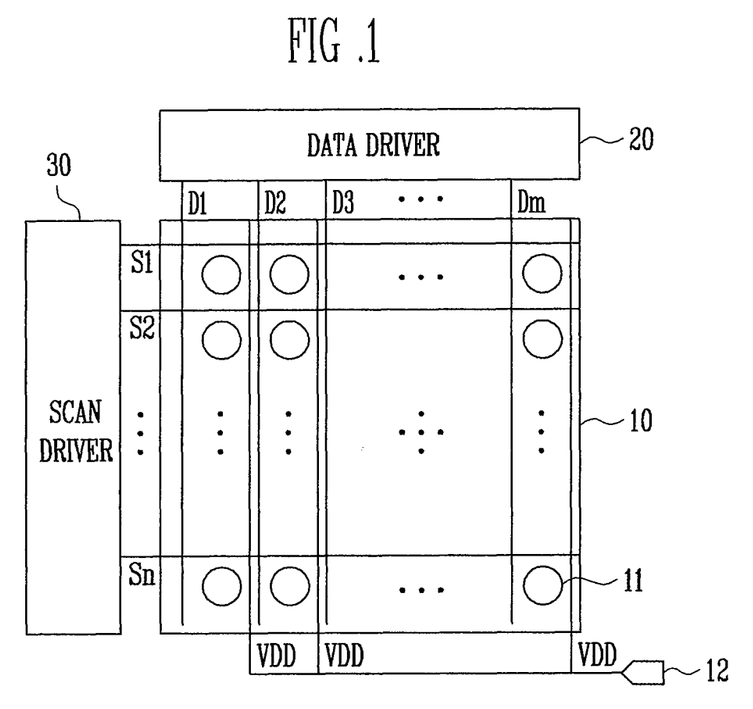
FIG. 1 is a block diagram illustrating a structure of a related organic light emitting display.

FIG. 1 is a block diagram illustrating the structure of a related organic light emitting display.

Referring to FIG. 1, the organic light emitting display includes an image display unit 10 for displaying an image, a data driver 20 for transmitting data signals, and a scan driver 30 for transmitting scan signals.

The image display unit 10 includes a plurality of pixels 11 including light emitting diodes and a pixel circuit, a plurality of scan lines S1, S2, . . . and Sn arranged in rows, a plurality of data lines D1, D2, D3, . . . and Dm arranged in columns, a plurality of pixel power source lines VDD for supplying power sources to the plurality of pixels, and a power supply source 12 for supplying a set or predetermined voltage to the pixel power source lines VDD.

In the image display unit 10, the scan signals transmitted from the scan lines S1, S2, . . . and Sn and the data signals transmitted from the data lines D1, D2, D3, . . . and Dm are applied to the pixels 11. Therefore, the pixel circuit included in each of the pixels 11 generates currents corresponding to the data signals and transmits the generated currents to the light emitting diodes to display an image.

In this case, a positive pixel driving voltage having a uniform level is applied to the pixels 11 through the pixel power source line VDD. However, as illustrated in FIG. 1, there are pixels 11 positioned to be relatively remote (e.g., when compared to other pixels 11) from the power supply source 12 for applying the pixel driving voltage. Therefore, due to non-uniformity of linear resistance in accordance with the lengths of the pixel power source lines VDD commonly coupled to the power supply source 12, the magnitudes of IR drops of the pixel driving voltages supplied to the pixels 11 vary.

That is, the magnitudes of the IR drops of the pixel power source lines VDD are small for the pixels 11 that are close to the power supply source 12, while the magnitudes of the IR drops of the pixel power source lines VDD increase as the pixels 11 are positioned further from the power supply source 12.

Therefore, in the related organic light emitting display, due to the non-uniformity of the IR drops of the pixel power source lines VDD in accordance with the positions of the pixels 11, the amount of current varies with the positions of the pixels 11 with respect to the same data signal so that light emission brightness is non-uniform. The above problem becomes severe as the panel is enlarged.

Figure 2:
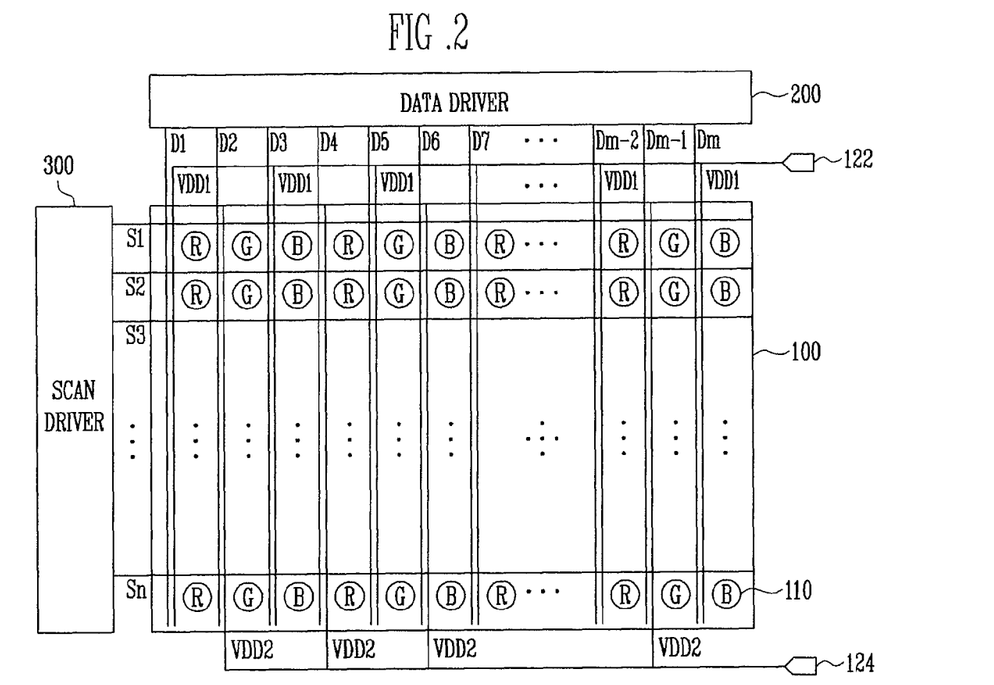
FIG. 2 is a block diagram illustrating a structure of an organic light emitting display according to an embodiment of the present invention.

FIG. 2 is a block diagram illustrating a structure of an organic light emitting display according to an embodiment of the present invention.

Referring to FIG. 2, the organic light emitting display according to the present embodiment includes an image display unit 100 for displaying an image, a data driver 200 for transmitting data signals, and a scan driver 300 for transmitting scan signals.

The image display unit 100 includes a plurality of pixels 110 each having a pair of light emitting diodes and a pixel circuit coupled to the light emitting diodes, a plurality of scan lines S1, S2, . . . and Sn arranged in a row, a plurality of data lines D1, D2, . . . , Dm−1, and Dm arranged in a column, first and second pixel power source lines VDD1 and VDD2 for transmitting pixel driving voltages to the plurality of pixels 110, and first and second power supply sources 122 and 124 for supplying the pixel driving voltages to the first and second pixel power source lines VDD1 and VDD2, respectively.

In particular, according to the present embodiment, in the first pixel power source lines VDD1 and the second pixel power source lines VDD2, the pixel power source lines for transmitting the pixel driving voltages to the pixels 110 are extended (e.g., withdrawn) in opposite directions. The pixels 110 include the pair of light emitting diodes. The light emitting diodes are coupled to the first pixel power source lines VDD1 and the second pixel power source lines VDD2, respectively.

That is, as illustrated in FIG. 2, the first pixel power source lines VDD1 are extended (e.g., withdrawn) from an upper side to a lower side of the image display unit 100 and the second pixel power source lines VDD2 are extended (e.g., withdrawn) from the lower side to the upper side of the image display unit 100 and are arranged between the first pixel power source lines VDD1.

The first pixel power source lines VDD1 receive a pixel driving voltage from the first power supply source 122 to transmit the received pixel driving voltage to the pixels 110 included in the image display unit 100. The second pixel power source lines VDD2 receive a pixel driving voltage from the second power supply source 124 to transmit the received pixel driving voltage to the pixels 110 included in the image display unit 100.

In the case of the first pixel power source lines VDD1, the magnitudes of the IR drops of the first pixel power source lines VDD1 increase toward the lower side of the image display unit 100, which is relatively remote from the first power supply source 122. Contrarily, in the case of the second pixel power source lines VDD2, the magnitudes of the IR drops of the second pixel power source lines VDD2 increase toward the upper side of the image display unit 100, which is relatively remote from the second power supply source 124.

Therefore, it is possible to reduce or prevent deviation in brightness of the image display unit 100 from being generated by a difference in the IR drops of the pixel power source lines VDD1 and VDD2 when the pixel driving voltages are applied to the pixels 110 through the pixel power source lines VDD1 and VDD2 only in the same direction.

The pixel driving voltages provided by the first and second power supply sources 122 and 124 have the same level. Therefore, the first and second power supply sources 122 and 124 may be realized (e.g., operated) by one apparatus.

The pixels 110 included in the image display unit 100 are coupled to the first pixel power source lines VDD1 and the second pixel power source lines VDD2. According to the present embodiment, as described above, a pair of light emitting diodes, that is, a first light emitting diode and a second light emitting diode, are included in each of the pixels 110.

The first light emitting diode is coupled to the first pixel power source lines VDD1 and the second light emitting diode is coupled to the second pixel power source lines VDD2.

Therefore, in a specific pixel included in the image display unit 100, when the magnitudes of the IR drops of the first pixel power source lines VDD1 coupled to the first light emitting diode are relatively small, the magnitudes of the IR drops of the second pixel power source lines VDD2 coupled to the second light emitting diode are relatively large.

As a result, since the distance from the pixel power sources 122 and 124 to the pixels 110 (e.g., the average combined length of the first and second pixel power source lines VDD1 and VDD2 to each pixel 110 from the first and second power sources 122 and 124) is uniform, that is, the magnitude of linear resistance is uniform, it is possible to reduce or prevent brightness non-uniformity of the image display unit 100 from being generated by the IR drops of the pixel power source lines.

Figure 3:
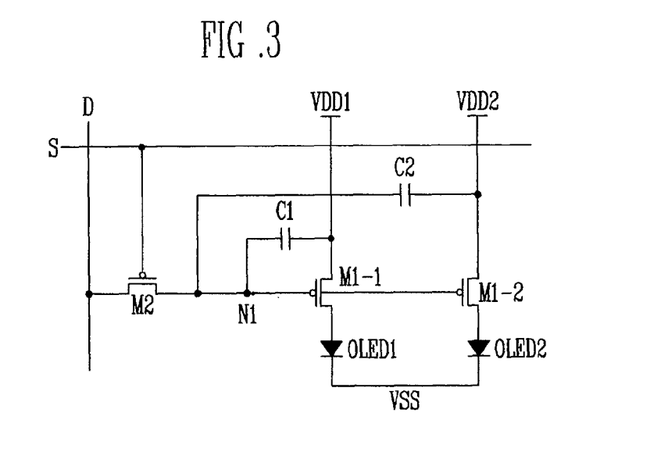
FIG. 3 is a circuit diagram illustrating a structure of a pixel illustrated in FIG. 2 according to an embodiment.

FIG. 3 is a circuit diagram illustrating the structure of the pixel illustrated in FIG. 2 according to an embodiment of the present invention.

The above is only an embodiment of the present invention, and the structure of the pixel according to the embodiment of the present invention is not limited to the above.

Referring to FIG. 3, the pixel includes a pixel circuit and first and second light emitting diodes OLED1 and OLED2. The pixel circuit includes a 1-1 transistor M1-1 coupled between the first light emitting diode OLED1 and the first pixel power source line VDD1 as a driving element, a 1-2 transistor M1-2 coupled between the second light emitting diode OLED2 and the second pixel power source line VDD2, a second transistor M2 coupled to the 1-1 transistor and the 1-2 transistor as a switching element, a first capacitor C1 coupled between a source and a gate of the 1-1 transistor M1-1, and a second capacitor C2 coupled between a source and a gate of the 1-2 transistor M1-2.

To be specific, the source electrode of the 1-1 transistor M1-1 is coupled to the first pixel power source line VDD1, a drain electrode of the 1-1 transistor M1-1 is coupled to an anode electrode of the first light emitting diode OLED1, and the gate electrode of the 1-1 transistor M1-1 is coupled to a first node N1.

The source electrode of the 1-2 transistor M1-2 is coupled to the second pixel power source line VDD2, a drain electrode of the 1-2 transistor M1-2 is coupled to an anode electrode of the second light emitting diode OLED2, and the gate electrode of the 1-2 transistor M1-2 is coupled to the first node N1.

The first node N1 is coupled to a drain electrode of the second transistor M2. The 1-1 transistor M1-1 and the 1-2 transistor M1-2 supply current corresponding to a data signal to the first light emitting diode OLED1 and the second light emitting diode OLED2, respectively. A base power source VSS is coupled to cathode electrodes of the first and second light emitting diodes OLED1 and OLED2.

A source electrode of the second transistor M2 is coupled to a data line D, the drain electrode of the second transistor M2 is coupled to the first node N1, and a gate electrode of the second transistor M2 is coupled to a scan line S. The second transistor M2 transmits the data signal to the first node N1 in accordance with a scan signal applied to the gate electrode.

In the first capacitor C1, a first electrode is coupled to the first power source supply line VDD1, and a second electrode is coupled to the first node N1. In the second capacitor C2, a first electrode is coupled to the second power source supply line VDD2, and a second electrode is coupled to the first node N1. The first and second capacitors C1 and C2 charge a charge (e.g., a voltage) in accordance with the data signal applied to the pixel and apply the data signal to the gates of the 1-1 and 1-2 transistors M1-1 and M1-2, respectively, for one frame by the charged charge so that the operations of the 1-1 and 1-2 transistors M1-1 and M1-2 are maintained for one frame.

That is, according to the present embodiment, the two light emitting diodes OLED1 and OLED2 are included in one pixel. The first and second light emitting diodes OLED1 and OLED2 may be realized so that separate anode electrodes are used and that the same cathode electrode is used.

According to the above structure, the two light emitting diodes OLED1 and OLED2 included in one pixel are coupled to different power source lines VDD1 and VDD2. Therefore, the IR drop effect of the power source lines VDD1 and VDD2 is offset so that it is possible to reduce or prevent the brightness non-uniformity of the image display unit 100 generated by the IR drops of the pixel power source lines VDD1 and VDD2.

Figure 4:
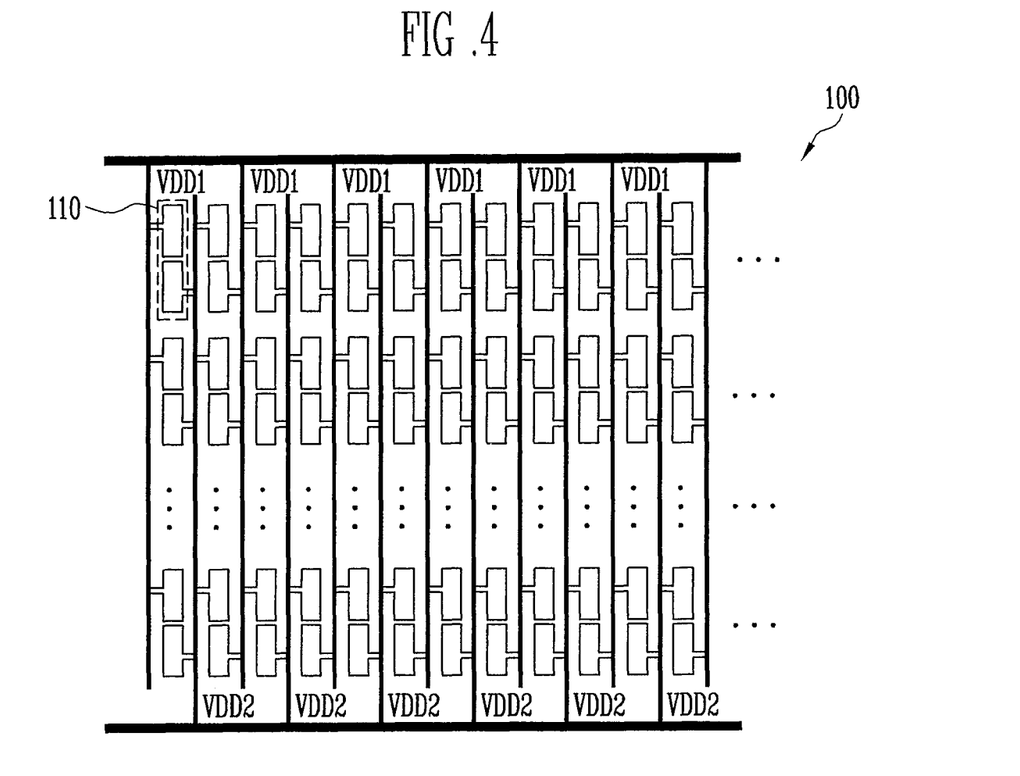
FIG. 4 is a view illustrating a coupling relationship between first and second pixel power source lines and pixels in detail according to the embodiment illustrated in FIG. 2.

FIG. 4 is a view illustrating a coupling relationship between first and second pixel power source lines and pixels in detail according to the embodiment illustrated in FIG. 2.

In FIG. 4, for convenience sake, the arrangements of scan lines and data lines are omitted.

Referring to FIG. 4, the first pixel power source lines VDD1 positioned on the upper side of the image display unit 100 are extended (e.g., withdrawn) downward, and the second pixel power source lines VDD2 positioned on the lower side of the image display unit 100 are extended (e.g., withdrawn) upward to be arranged among the first pixel power source lines VDD1.

That is, the first pixel power source lines VDD1 are arranged, for example, in the odd columnar direction of the image display unit 100 and the second pixel power source lines VDD2 are arranged in the even columnar direction of the image display unit 100.

The pixels 110 included in the image display unit 100 are coupled to the first pixel power source lines VDD1 and the second pixel power source lines VDD2. As illustrated in FIG. 3, each of the pixels 110 includes the pair of light emitting diodes, that is, the first and second light emitting diodes OLED1 and OLED2. That is, the first light emitting diode OLED1 is coupled to the first pixel power source line VDD1, and the second light emitting diode OLED2 is coupled to the second pixel power source line VDD2.

Therefore, since the sum of the lengths of (e.g., the distance from) the first pixel power source lines VDD1 and the second pixel power source lines VDD2 to the pixels 110, that is, the magnitude of the linear resistance, is uniform, it is possible to reduce or prevent the brightness non-uniformity of the image display unit 100 generated by the IR drops of the pixel power source lines VDD1 and VDD2.

Figure 5:
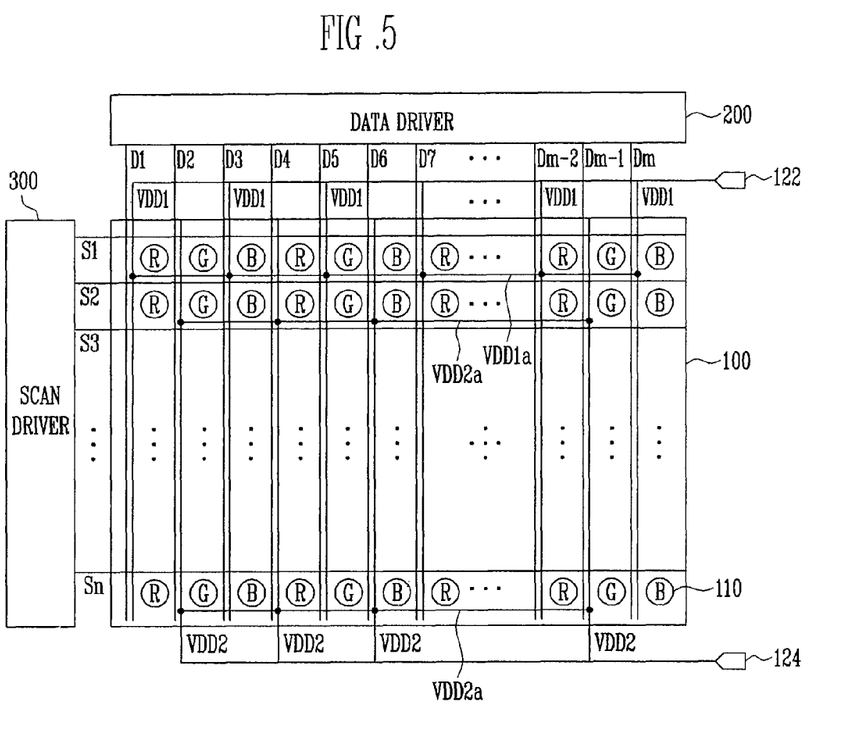
FIG. 5 is a block diagram illustrating a structure of an organic light emitting display according to another embodiment of the present invention.

FIG. 5 is a block diagram illustrating a structure of an organic light emitting display according to another embodiment of the present invention.

When the embodiment illustrated in FIG. 5 is compared with the embodiment illustrated in FIG. 2, in order to address the problem of the IR drops of the first and second pixel power source lines VDD1 and VDD2 arranged to extend in a first direction, first and second auxiliary pixel power source lines VDD1a and VDD2a arranged to extend in a second direction (e.g., the second direction is perpendicular to the first direction of the first and second pixel power source lines VDD1 and VDD2) are further formed. Since the other components and coupling relations are the same as illustrated in the embodiment illustrated in FIG. 2, the same components are denoted by the same reference numerals and detailed description thereof will not be provided again.

That is, the first auxiliary pixel power source lines VDD1*a* are arranged in the second direction and are coupled to the first pixel power source lines VDD1 in a mesh and the second auxiliary pixel power source lines VDD2*a* are arranged among the first auxiliary pixel power source lines VDD1*a* and are coupled to the second pixel power source lines VDD2 in a mesh.

In the present embodiment, the first and second auxiliary pixel power source lines VDD1*a* and VDD2*a* may be formed of a metal material having low resistivity. The first and second auxiliary pixel power source lines VDD1*a* and VDD2*a* are electrically coupled to the first and second pixel power source lines VDD1 and VDD2 to reduce the linear resistance of the first and second pixel power source lines VDD1 and VDD2. As a result, it is possible to address the problem of the IR drops of the first and second pixel power source lines VDD1 and VDD2.

Since the first and second auxiliary pixel power source lines VDD1*a* and VDD2*a* are formed in a different layer from the first and second pixel power source lines VDD1 and VDD2, contact holes are formed at crossing regions of the first auxiliary pixel power source lines VDD1*a* and the first pixel power source lines VDD1 and at crossing regions of the second auxiliary pixel power source lines VDD2*a* and the second pixel power source lines VDD2. Through the contact holes, the first and second auxiliary pixel power source lines VDD1*a* and VDD2*a* are electrically coupled to the first and second pixel power source lines VDD1 and VDD2, respectively.

Figure 6:
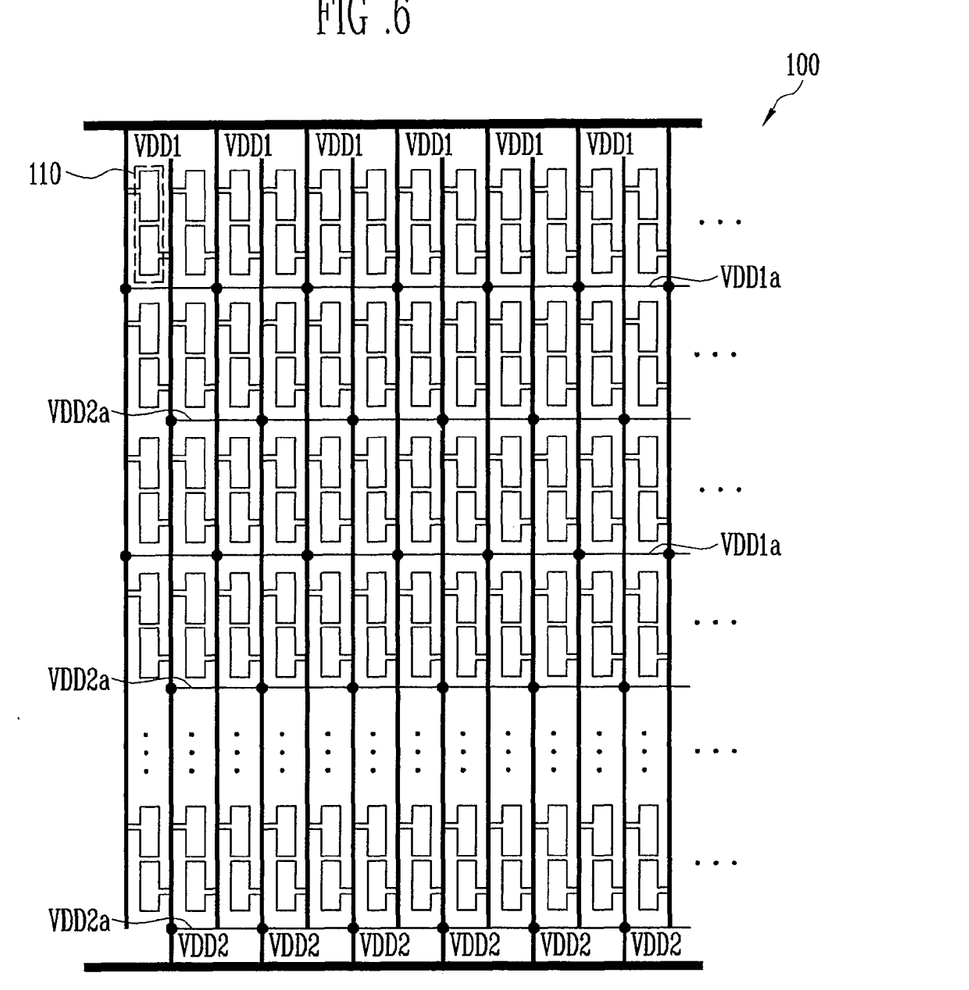
FIG. 6 is a view illustrating a coupling relationship between the first and second pixel power source lines, first and second auxiliary pixel power source lines, and the pixels in detail according to the embodiment illustrated in FIG. 5.

FIG. 6 is a view illustrating a coupling relationship between the first and second pixel power source lines, the first and second auxiliary pixel power source lines, and the pixels in detail according to the embodiment illustrated in FIG. 5.

In FIG. 6, for convenience sake, the arrangements of the scan lines and the data lines are omitted. In FIG. 6, the first and second auxiliary pixel power source lines VDD1*a* and VDD2*a* are added to the embodiment illustrated in FIG. 4.

Referring to FIG. 6, the first pixel power source lines VDD1 positioned on the upper side of the image display unit 100 are extended (e.g., withdrawn) downward, and the second pixel power source lines VDD2 positioned on the lower side of the image display unit 100 are extended (e.g., withdrawn) upward and are arranged among the first pixel power source lines VDD1.

That is, the first pixel power source lines VDD1 are arranged, for example, to extend in the odd columnar direction of the image display unit 100, and the second pixel power source lines VDD2 are arranged to extend in the even columnar direction of the image display unit 100.

The first auxiliary pixel power source lines VDD1*a* are arranged to extend in a row direction to be coupled to the first pixel power source lines VDD1 in a mesh. The second auxiliary pixel power source lines VDD2*a* are arranged among the first auxiliary pixel power source lines VDD1*a* to be coupled to the second pixel power source lines VDD2 in a mesh.

The first auxiliary pixel power source lines VDD1*a* are arranged, for example, to extend in the odd row direction of the image display unit 100 to be coupled to the first pixel power source lines VDD1 in a mesh. The second auxiliary pixel power source lines VDD2*a* are arranged to extend in the even row direction of the image display unit 100 to be coupled to the second pixel power source lines VDD2 in a mesh.

Since the first and second auxiliary pixel power source lines VDD1*a* and VDD2*a* are formed in a different layer from the first and second pixel power source lines VDD1 and VDD2, contact holes are formed at crossing regions of the first auxiliary pixel power source lines VDD1*a* and the first pixel power source lines VDD1, and at crossing regions of the second auxiliary pixel power source lines VDD2*a* and the second pixel power source lines VDD2, as illustrated in FIG. 6. Through the contact holes, the first and second auxiliary pixel power source lines VDD1*a* and VDD2*a* are electrically coupled to the first and second pixel power source lines VDD1 and VDD2, respectively.

In the embodiment illustrated in FIG. 6, like in the embodiment illustrated in FIG. 4, each of the plurality of pixels 110 included in the image display unit 100 includes a pair of light emitting diodes, that is, first and second light emitting diodes OLED1 and OLED2 (shown in FIG. 4). The first light emitting diode is coupled to the first pixel power source line VDD1, and the second light emitting diode is coupled to the second pixel power source line VDD2.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display, comprising:
an image display unit in which a plurality of pixels are arranged;
first pixel power source lines and second pixel power source lines configured to transmit a first constant pixel driving voltage and a second constant pixel driving voltage, respectively, to the plurality of pixels; and
a first power supply source and a second power supply source configured to provide the constant pixel driving voltages to the first pixel power source lines and the second pixel power source lines, respectively,
wherein each of the plurality of pixels comprises a first light emitting diode and a second light emitting diode and a pixel circuit coupled to the first and second light emitting diodes, and
wherein an anode of the first light emitting diode in each of the pixels is coupled to a corresponding first pixel power source line of the first pixel power source lines, and an anode of the second light emitting diode in each of the pixels is coupled to a corresponding second pixel power source line of the second pixel power source lines.

2. The organic light emitting display as claimed in claim 1, wherein the first pixel power source lines and the second pixel power source lines are extended in opposite directions.

3. An organic light emitting display, comprising:
an image display unit in which a plurality of pixels are arranged;
first pixel power source lines and second pixel power source lines for transmitting pixel driving voltages to the plurality of pixels; and
a first power supply source and a second power supply source for providing the pixel driving voltages to the first pixel power source lines and the second pixel power source lines, respectively,
wherein each of the plurality of pixels comprises a first light emitting diode and a second light emitting diode and a pixel circuit coupled to the first and second light emitting diodes, and
wherein the first light emitting diode in each of the pixels is coupled to a corresponding first pixel power source line of the first pixel power source lines, and the second light emitting diode in each of the pixels is coupled to a corresponding second pixel power source line of the second pixel power source lines, wherein the first pixel power source lines and the second pixel power source lines are extended in opposite directions, and wherein the first pixel power source lines are extended from an upper side to a lower side of the image display unit, and the second pixel power source lines are extended from the lower side to the upper side of the image display unit and are arranged among the first pixel power source lines.

4. The organic light emitting display as claimed in claim 3, wherein the first pixel power source lines are arranged in odd numbered columns of the image display unit, and the second pixel power source lines are arranged in even numbered columns of the image display unit.

5. An organic light emitting display, comprising:

an image display unit in which a plurality of pixels are arranged;

first pixel power source lines and second pixel power source lines for transmitting pixel driving voltages to the plurality of pixels; and a first power supply source and a second power supply source for providing the pixel driving voltages to the first pixel power source lines and the second pixel power source lines, respectively, wherein each of the plurality of pixels comprises a first light emitting diode and a second light emitting diode and a pixel circuit coupled to the first and second light emitting diodes, wherein the first light emitting diode in each of the pixels is coupled to a corresponding first pixel power source line of the first pixel power source lines, and the second light emitting diode in each of the pixels is coupled to a corresponding second pixel power source line of the second pixel power source lines, and wherein the pixel driving voltages provided by the first and second power supply sources are positive voltages of a same level.

6. An organic light emitting display, comprising:

an image display unit in which a plurality of pixels are arranged;

first pixel power source lines and second pixel power source lines for transmitting pixel driving voltages to the plurality of pixels;

a first power supply source and a second power supply source for providing the pixel driving voltages to the first pixel power source lines and the second pixel power source lines, respectively;

first and second auxiliary pixel power source lines arranged to extend in a direction crossing the first and second pixel power source lines, wherein each of the plurality of pixels comprises a first light emitting diode and a second light emitting diode and a pixel circuit coupled to the first and second light emitting diodes, wherein the first light emitting diode in each of the pixels is coupled to a corresponding first pixel power source line of the first pixel power source lines, and the second light emitting diode in each of the pixels is coupled to a corresponding second pixel power source line of the second pixel power source lines.

7. The organic light emitting display as claimed in claim 6, wherein the first auxiliary pixel power source lines are coupled to the first pixel power source lines in a mesh pattern, and the second auxiliary pixel power source lines are arranged among the first auxiliary pixel power source lines and are coupled to the second pixel power source lines in a mesh pattern.

8. The organic light emitting display as claimed in claim 6, wherein the first and second auxiliary pixel power source lines are formed of a low resistivity metal material and are formed in a different layer from that of the first and second pixel power source lines.

9. The organic light emitting display as claimed in claim 8, wherein contact holes are formed at crossing regions of the first auxiliary pixel power source lines and the first pixel power source lines and at crossing regions of the second auxiliary pixel power source lines and the second pixel power source lines, and the first and second auxiliary pixel power source lines are electrically coupled to the first and second pixel power source lines, respectively, through the contact holes.

* * * * *